(12) United States Patent
Sandner et al.

(10) Patent No.: US 7,602,254 B2
(45) Date of Patent: Oct. 13, 2009

(54) SYSTEM AND METHOD FOR GENERATING SIGNALS WITH A PRESELECTED FREQUENCY RELATIONSHIP IN TWO STEPS

(75) Inventors: Christoph Sandner, Villach (AT); Staffan Ek, Villach (AT); Stefano Marsili, Spittal/Drau (AT)

(73) Assignee: Infineon Technologies AG, Neubiberg (DE)

( * ) Notice: Subject to any disclaimer, the term of this patent is extended or adjusted under 35 U.S.C. 154(b) by 50 days.

(21) Appl. No.: 11/753,999

(22) Filed: May 25, 2007

(65) Prior Publication Data

US 2008/0290953 A1 Nov. 27, 2008

(51) Int. Cl.
*H03L 7/22* (2006.01)

(52) U.S. Cl. ............... 331/2; 331/16; 331/18; 327/147; 327/149; 455/260

(58) Field of Classification Search ....... 331/2, 331/16, 18, 25, 45–57; 327/147–150, 156–159; 332/127; 360/51; 375/376; 455/260
See application file for complete search history.

(56) References Cited

U.S. PATENT DOCUMENTS

| | | | | |
|---|---|---|---|---|
| 4,659,999 A | * | 4/1987 | Motoyama et al. ........... | 331/2 |
| 4,720,688 A | * | 1/1988 | Hasegawa et al. ........... | 331/2 |
| 4,868,522 A | * | 9/1989 | Popat et al. ............... | 331/2 |
| 5,565,816 A | * | 10/1996 | Coteus ..................... | 331/2 |
| 6,111,712 A | * | 8/2000 | Vishakhadatta et al. ...... | 360/51 |
| 6,437,650 B1 | * | 8/2002 | Sung et al. ................ | 331/25 |
| 2005/0255822 A1 | | 11/2005 | Friedrich et al. | |
| 2006/0111072 A1 | * | 5/2006 | Kerth et al. ............... | 455/302 |
| 2007/0140645 A1 | | 6/2007 | Marsili et al. | |

FOREIGN PATENT DOCUMENTS

| WO | WO 2005/074152 A1 | 8/2005 |
|---|---|---|
| WO | WO 2006/075288 A1 | 7/2006 |

OTHER PUBLICATIONS

Batra, A., "Project: IEEE P802.15 Working Group for Wireless Personal Area Networks (WPANs):Multi-band OFDM Physical Layer Proposal," Texas Instruments, et al., IEEE 802.15-03/267r1, Jul. 14, 2003, 53 pages.

Razavi, B., et al., "A 0.13μm CMOS UWB Transceiver," IEEE International Solid-State Circuits Conference, 2005, Session 11, Ultra Wideband Solutions 11.9, pp. 216-217, 594.

* cited by examiner

*Primary Examiner*—David Mis
(74) *Attorney, Agent, or Firm*—Slater & Matsil, L.L.P.

(57) ABSTRACT

System and method for generating multiple local oscillator signals comprising a first-stage phase-locked loop (PLL) having an input to receive a first reference signal input and having an output to transmit a second reference signal, wherein the second reference signal is an integer or fractional multiple of the first reference signal; and a plurality of second-stage PLLs, each second-stage PLL having an input coupled to the output of the first-stage PLL and receiving the second reference signal, and each second-stage PLL having an output for transmitting a local oscillator signal, wherein each of the local oscillator signals is an integer multiple of the second reference signal.

54 Claims, 2 Drawing Sheets

SYSTEM AND METHOD FOR GENERATING SIGNALS WITH A PRESELECTED FREQUENCY RELATIONSHIP IN TWO STEPS

BACKGROUND

In many systems, for example, UWB systems that follow the WiMedia standard (an ISO-published radio platform standard for high-speed ultra wideband (UWB) wireless connectivity), specific local oscillator (LO) frequency characteristics are required or desirable. For example, to implement the WiMedia standard, at least 3 LO frequencies must be generated per band group. The number of required LO frequencies increases when the system supports multiple band groups. The system must be able to switch between the band groups within 300 ns and must be able to hop among the 3 LO frequencies in a band group in less than 10 ns. There are also phase coherency requirements when hopping between frequencies.

Approaches such as switching the reference frequency of a phase-locked loop (PLL), using a digital PLL with a digital controlled oscillator (DCO), and/or storing the frequency information of the DCO for fast-hopping will not provide the required UWB LO signals.

SUMMARY OF THE INVENTION

Embodiments of the present invention are directed to a circuit for generating multiple local oscillator signals, comprising a first-stage phase-locked loop (PLL) having an input to receive a first reference signal input and having an output to transmit a second reference signal, wherein the second reference signal is an integer or fractional multiple of the first reference signal. A plurality of second-stage PLLs each have an input coupled to the output of the first-stage PLL and receive the second reference signal. Each second-stage PLL has an output for transmitting a local oscillator signal, wherein each of the local oscillator signals is an integer multiple of the second reference signal.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The present invention provides many applicable inventive concepts that can be embodied in a wide variety of specific contexts. The specific embodiments discussed are merely illustrative of specific ways to make and use the invention, and do not limit the scope of the invention.

Embodiments of the present invention provide a two-step PLL for example to provide desired UWB LO signals, and are easily extendable to more than one UWB band group by extending the first or reference PLL. Embodiments of the present invention do not require a mixer and therefore can avoid the disadvantages of known LO generators. Due to the two-step approach, integrated phase noise may be improved compared to current solutions because the reference frequency for the second PLLs is higher. The present invention can also be embodied in a smaller chip area, thereby allowing for shorter LO lines which saves current by eliminating the need for LO buffers. The ring oscillators used in the present LO generator can also be placed close to the transmit and receive mixers in the UWB system, which allows power savings.

Figure 1:
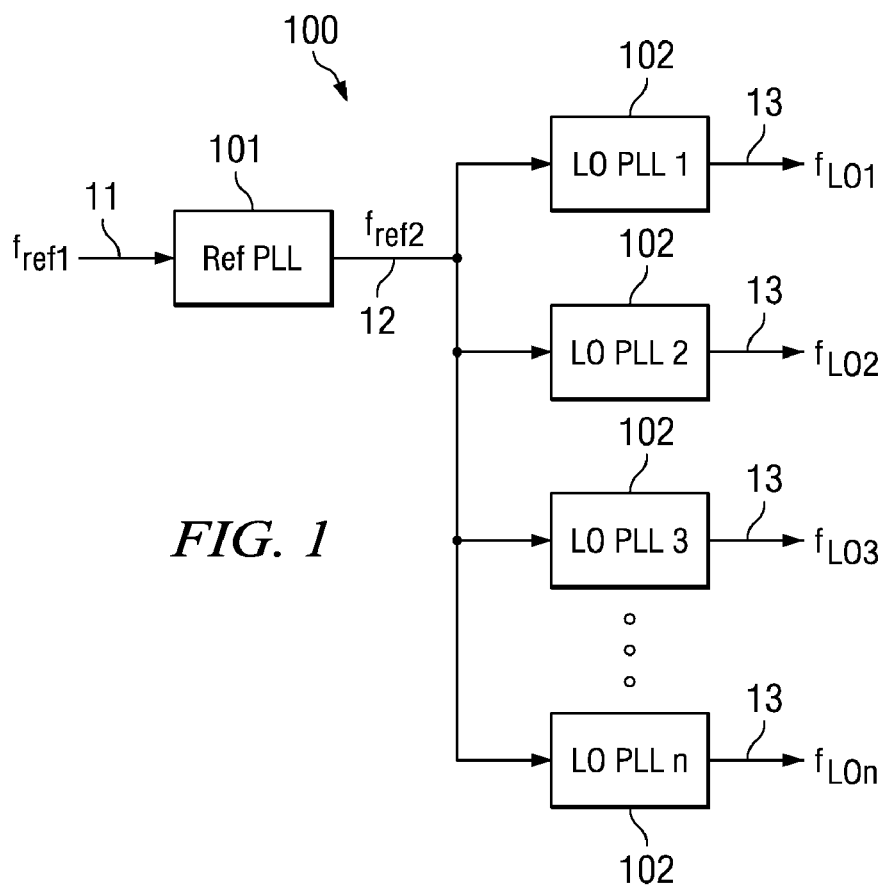
FIG. 1 is a block diagram of one embodiment of the present invention.

FIG. 1 is a block diagram of a UWB LO generator 100 according to one embodiment of the invention. LO generator 100 uses a two-step frequency conversion. First frequency conversion block 101 is a PLL having reference input signal $f_{ref1}$ 11 and output signal $f_{ref2}$ 12. The second stage is comprised of a multitude of frequency conversion blocks or PLLs 102 that are connected to PLL 101 and that receive signal $f_{ref2}$ 12 as an input. In a UWB system that requires three LOs for a band group, three separate PLLs 102 are used; however, as shown in FIG. 1, multiple PLLs 102 of any number may be used to provide from one to "n" $f_{LO}$ output signals 13. PLLs 102 each provide separate output signals $f_{LO(1 \ldots n)}$ 13. The frequency offset between each $f_{LO}$ signal (i.e. between $f_{LO(i)}$ and $f_{LO(i+1)}$) is always the same.

In one embodiment of LO generator 100, first stage Reference PLL 101 is an LC-PLL, and second-stage LO PLLs 102 are Ring Oscillator PLLs. According to one embodiment, reference PLL 101 may provide a flexible adaptation to different input reference frequencies $f_{ref1}$ 11, but has a fixed output frequency $f_{ref2}$ 12 that is greater than $f_{ref1}$ 12. Input reference signal $f_{ref1}$ 11 may come from a crystal oscillator, a high accuracy reference clock external of the chip, or a similar device. Reference PLL 101 may have either an integer or fractional relationship between $f_{ref1}$ 11 and $f_{ref2}$ 12. According to one embodiment, the relationship between $f_{ref1}$ 11 and $f_{ref2}$ 12 is programmable. Reference PLL 101 may have a LC-VCO and moderate loop bandwidth to obtain as low inband phase noise as possible. Reference PLL 101 may be a classical analog loop or a digital PLL.

Second-stage LO PLLs 102 have an integer relationship between input $f_{ref2}$ 12 and output $f_{LO(1 \ldots n)}$ 13. In one embodiment, LO PLLs 102 use a ring oscillator topology for low area. The ring oscillator may have two stages to provide four-phase output at $f_{LO(1 \ldots n)}$ 13. The second-stage LO PLLs 102 also may have a wide bandwidth to suppress phase noise of the ring oscillator and to allow for very fast reactions to changes of the band group. The outputs of LO PLLs 102 may be coupled to a multiplexer or other mechanism to select one LO signal (i.e. one of the $f_{LO(1 \ldots n)}$ 13 signals) per band group. In an alternative embodiment, the second-stage LO PLLs 102 may use an injection-locking technique to lock to the phase and frequency of $f_{ref2}$ 12. It will be further understood that any frequency conversion circuit may be used, such as, for example, a delay-locked loop (DLL).

Figure 2:
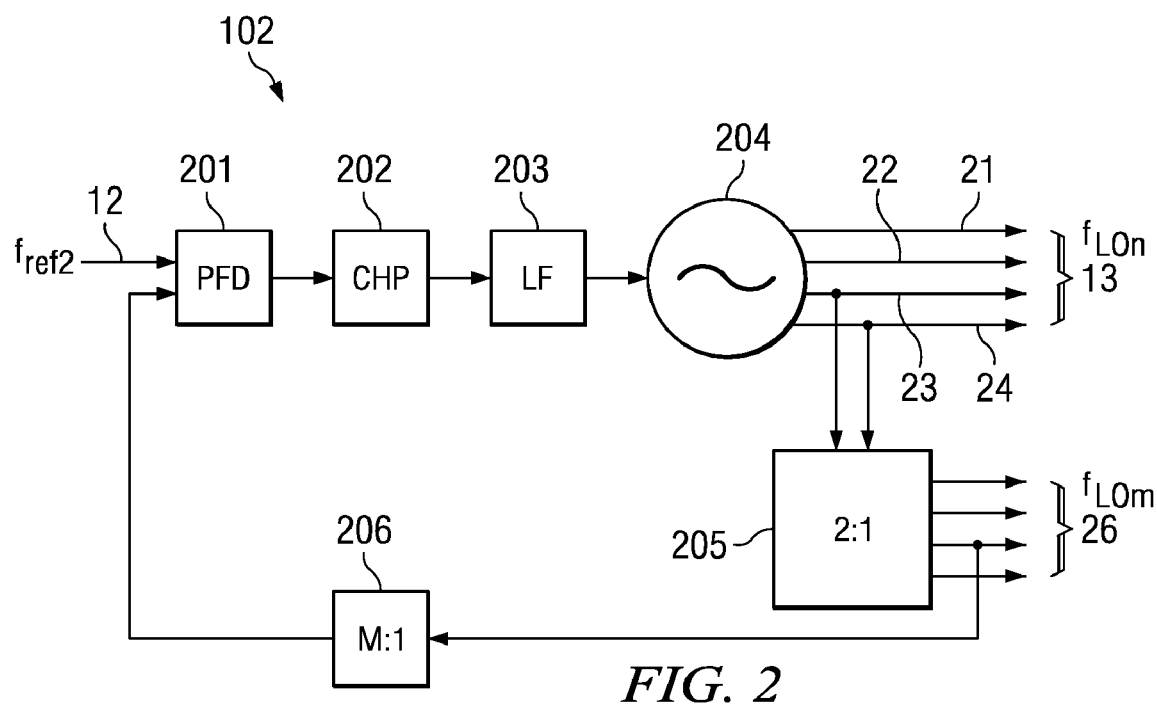
FIG. 2 is a block diagram of a second-stage phase locked loop according to one embodiment of the present invention.

FIG. 2 illustrates one implementation of second-stage LO PLL 102. Input $f_{ref2}$ 12 is received by phase-frequency detector (PFD) 201, which provides an input to charge pump (CHP) 202 that in turn provides an input to loop filter (LF) 203. The output of loop filter 203 is a voltage control signal driving voltage-controlled oscillator (VCO) 204, which provides output $f_{LOn}$ 13. Preferably, output $f_{LOn}$ 13 is available as quadrature signals 21-24 representing 90 degree phase shifts at the output frequency $f_{LOn}$ 13.

The WiMedia bandplan specifies that some $f_{LO}$ frequencies ($f_{LOm}$ 26) will have a 2:1 relation to others frequencies ($f_{LOn}$ 13). Therefore, for WiMedia implementations, the $f_{LOm}$ 26 signals may be derived directly from the $f_{LO_n}$ 13 output using a 2:1 divider stage 205. According to one embodiment, divided-down output $f_{LOm}$ 26 is also comprised of four quadrature signals. A feedback loop provides another input to phase frequency detector 201 via M:1 divider stage 206, wherein the value of M is an integer selected based upon the value of output $f_{LOm}$ 26 and input signal $f_{ref2}$ 12.

Figure 3:
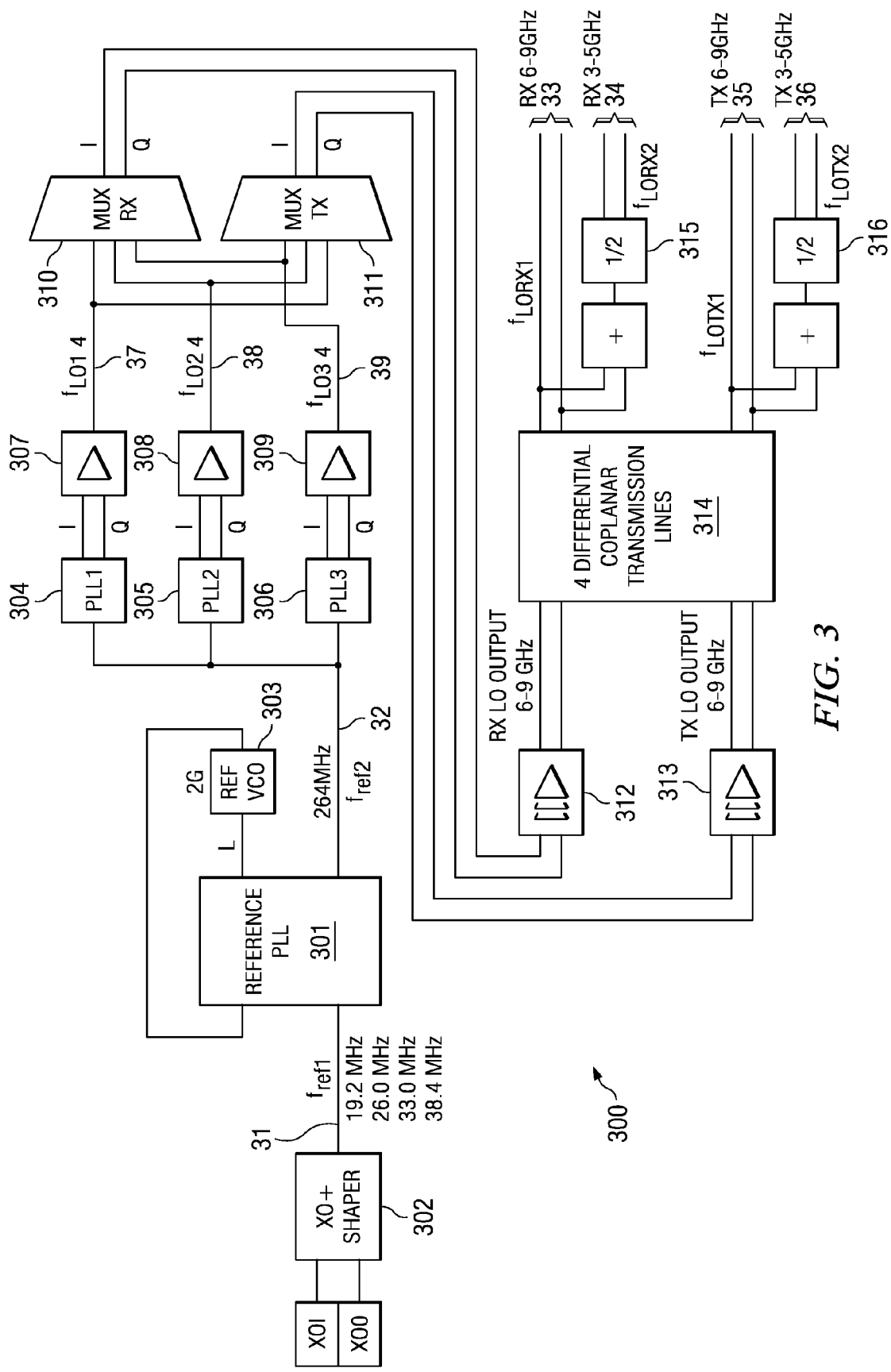
FIG. 3 is a block diagram of an alternative embodiment of the present invention.

FIG. 3 is a block diagram of one embodiment of the present invention that provides transmit and receive LO signals for two WiMedia band groups. LO generator 300 has a first stage Reference PLL 301 that receives input $f_{ref1}$ 31 from XO+ Shaper 302. The $f_{ref1}$ 31 input may be, for example, a signal at 19.2 MHz, 26.0 MHz, 33.0 MHz, or 38.4 MHz depending upon the desired output signals 33-36. VCO 303 provides feedback to Reference PLL 301 based upon the output $f_{ref2}$ 32. Reference PLL 301 is coupled to PLL1-PLL3 304-306, which receive $f_{ref2}$ 32 as an input. In one embodiment $f_{ref2}$ 32 may be a signal at 264 MHz and the outputs $f_{LO1-3}$ 37-39 of PLL1-PLL3 304-306 may be in the range of 6-9 GHz. In other embodiments, $f_{ref2}$ 32 may be 132 MHz, 528 MHz or some other frequency that follows the format $(2^n)\cdot 264$ MHz or $(\frac{1}{2})^n\cdot 264$ MHz.

Output signal $f_{LO1-3}$ 37-39 pass through buffers 307-309 to receiver multiplexer (MUX RX) 310 and transmitter multiplexer (MUX TX) 311. Multiplexers 310 and 311 select one of the three signals in the band group to pass on to the transmit and receive mixers. The selected signals are passed to receive and transmit amplifiers 312 and 313 and transmitted via coplanar transmission lines 314 to output $f_{LORX1}$ 33 and $f_{LOTX1}$ 35. The $f_{LORX1}$ 33 and $f_{LOTX1}$ 35 signals may be divided down via 2:1 divider stages 315 and 316, respectively, to generate $f_{LORX2}$ 34 and $f_{LOTX2}$ 36.

LO generator 300 provides LO signals $f_{LORX1}$ 33 and $f_{LORX2}$ 34 for receive mixers (not shown) and LO signals $f_{LOTX1}$ 35 and $f_{LOTX2}$ 36 for transmitter mixers (not shown). LO outputs 34 and 36 may correspond to WiMedia band group 1, for example, which is approximately half the frequency range of WiMedia band groups 3 and 6. Accordingly, LO outputs 33 and 35 may also correspond to WiMedia band groups 3 or 6.

In one embodiment, multiplexers 310 and 311 may be replaced with a single multiplexer coupled to buffers 307-309. The output of the single multiplexer could then be split to the transmit and receive mixers.

Divider stages 315 and 316 may also be removed in one embodiment. Instead of using the divider stages to generate outputs $f_{LORX2}$ 34 and $f_{LOTX2}$ 36, PLL1-PLL3 304-306 could be modified to use a wideband oscillator and to divide the feedback divisor by two. This would result in the frequency of $f_{LORX2}$ 34 and $f_{LOTX2}$ 36 being generated at the output of PLL1-PLL3 304-306, which could then be routed to the transmit and receive mixers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A circuit for generating multiple output signals, comprising:
    a first-stage frequency conversion block comprising a first-stage input signal and a first-stage output signal, wherein a frequency of the first-stage output signal is a preselected ratio of a frequency of the first-stage input signal; and
    a plurality of second-stage frequency conversion blocks, each comprising a second-stage input coupled to the first-stage output signal, and each second-stage frequency conversion block transmitting a second-stage output signal, wherein a frequency of the second-stage output signal is a preselected ratio of the frequency of the first-stage input signal and wherein a frequency of the second-stage input signal is higher than the frequency of the first-stage input signal;
    dividers coupled to the second-stage output signals, wherein the dividers divide a frequency of a selected second-stage output signal; and
    one or more multiplexers coupled to outputs of the dividers.

2. The circuit of claim 1, wherein the first-stage frequency conversion block or the second frequency conversion block or both are phase-locked loops (PLL).

3. The circuit of claim 1, wherein the first-stage frequency conversion block or the second-stage frequency conversion block or both are delay-locked loops (DLL).

4. The circuit of claim 1, wherein the preselected ratio between the frequency of the first-stage input signal and the frequency of the first-stage output signal is programmable.

5. The circuit of claim 1, wherein the preselected ratio between the frequency of the first-stage output signal and the frequency of the second-stage output signal from each second-stage frequency conversion block is programmable.

6. The circuit of claim 1, wherein the frequency of the first-stage output signal is an integer or fractional multiple of the frequency of the first-stage input signal.

7. The circuit of claim 1, wherein the frequency of the second-stage output signal from each second-stage frequency conversion block is an integer multiple of the frequency of the first-stage input signal.

8. The circuit of claim 1, further comprising:
    one or more multiplexers for selecting one of the second-stage output signals.

9. The circuit of claim 8, further comprising:
    a mixer coupled to outputs of the one or more multiplexers.

10. The circuit of claim 8, further comprising:
    a divider coupled to outputs of the one or more multiplexers.

11. The circuit of claim 1, further comprising:
    a mixer coupled to an output of the divider.

12. The circuit of claim 1, wherein each of the second-stage output signals comprises quadrature signals.

13. The circuit of claim 2, wherein the second stage PLLs are ring oscillator PLLs.

14. The circuit of claim 1, wherein the frequency of the first input signal is between 20 and 50 MHz.

15. The circuit of claim 1, wherein the second-stage output signals correspond to frequencies in a WiMedia band group.

16. The circuit of claim 1, wherein the plurality of second stage frequency conversion blocks comprise at least three phase-locked loops (PLLs), and wherein a frequency offset between a first second-stage output signal and a second second-stage output signal is the same as a frequency offset between the second-stage output signal and a third second-stage output signal.

17. A method for generating signals, comprising:
providing a first reference signal to a first-stage frequency conversion circuit;
generating a second reference signal by the first-stage frequency conversion circuit, wherein a frequency of the second reference signal has a preselected relationship to a frequency of the first reference signal and wherein the frequency of the second reference signal is higher than the frequency of the first reference signal;
providing the second reference signal to a plurality of second-stage frequency conversion circuits; and
generating a plurality of second-stage output signals by each second-stage frequency conversion circuit wherein a frequency of each second-stage output signal has a preselected relationship to the frequency of the second reference signal;
providing one or more of the second-stage output signals to one or more dividers, wherein the dividers divide a frequency of a selected second-stage output signal;
providing one or more outputs of the dividers to one or more multiplexers; and
selecting one of the outputs of the dividers.

18. The method of claim 17, wherein the first-stage frequency conversion circuit is a phase-locked loop (PLL).

19. The method of claim 17, wherein the first-stage frequency conversion circuit is a delay-locked loop (DLL).

20. The method of claim 17, wherein the preselected relationship between the frequency of the second reference signal and the frequency of the first reference signal is programmable.

21. The method of claim 17, wherein the preselected relationship between the frequency of the second reference signal and the frequency of the first reference signal is an integer or fractional multiple.

22. The method of claim 17, wherein the preselected relationship between the frequency of the second-stage output signal and the frequency of the second reference signal is an integer multiple.

23. The method of claim 17, further comprising:
selecting one of the second-stage output signals using one or more multiplexers.

24. The method of claim 23, further comprising:
providing one or more outputs of the multiplexers to a mixer.

25. The method of claim 17, further comprising:
providing one or more outputs of the multiplexers to one or more mixers.

26. The method of claim 17, wherein the frequency of the first reference signal is between 20 and 50 MHz.

27. The method of claim 17, wherein the second-stage output signals correspond to frequencies in a WiMedia band group.

28. A circuit for generating multiple output signals, comprising:
a first-stage frequency conversion block comprising a first-stage input signal and a first-stage output signal, wherein a frequency of the first-stage output signal is a preselected ratio of a frequency of the first-stage input signal;
a plurality of second-stage frequency conversion blocks, each comprising a second-stage input coupled to the first-stage output signal, and each second-stage frequency conversion block transmitting a second-stage output signal, wherein a frequency of the second-stage output signal is a preselected ratio of the frequency of the first-stage input signal and wherein each of the second-stage output signals comprises quadrature signals; and
one or more multiplexers for selecting one of the second-stage output signals.

29. The circuit of claim 28, further comprising:
a mixer coupled to outputs of the one or more multiplexers.

30. The circuit of claim 28, further comprising:
a divider coupled to outputs of the one or more multiplexers.

31. The circuit of claim 28, wherein the preselected ratio between the frequency of the first-stage output signal and the frequency of the second-stage output signal from each second-stage frequency conversion block is programmable.

32. The circuit of claim 28, wherein the frequency of the first-stage output signal is an integer or fractional multiple of the frequency of the first-stage input signal.

33. The circuit of claim 28, wherein the frequency of the second-stage output signal from each second-stage frequency conversion block is an integer multiple of the frequency of the first-stage input signal.

34. The circuit of claim 28, wherein the first-stage frequency conversion block or the second frequency conversion block or both are phase-locked loops (PLL).

35. The circuit of claim 28, wherein the first-stage frequency conversion block or the second-stage frequency conversion block or both are delay-locked loops (DLL).

36. The circuit of claim 28, further comprising:
a mixer coupled to outputs of the one or more multiplexers.

37. The circuit of claim 28, further comprising:
a divider coupled to outputs of the one or more multiplexers.

38. The circuit of claim 28, wherein the preselected ratio between the frequency of the first-stage output signal and the frequency of the second-stage output signal from each second-stage frequency conversion block is programmable.

39. A circuit for generating multiple output signals, comprising:
a first-stage frequency conversion block comprising a first-stage input signal and a first-stage output signal, wherein a frequency of the first-stage output signal is a preselected ratio of a frequency of the first-stage input signal; and
a plurality of second-stage frequency conversion blocks, each comprising a second-stage input coupled to the first-stage output signal, and each second-stage frequency conversion block transmitting a second-stage output signal, wherein a frequency of the second-stage output signal is a preselected ratio of the frequency of the first-stage input signal, wherein each of the second-stage frequency conversion blocks comprise a PLL and wherein each of the second-stage output signals comprises quadrature signals.

40. The circuit of claim 39, wherein the second stage output signals are selected by using one or more multiplexers.

41. The circuit of claim 40, further comprising:
a mixer coupled to outputs of one or more multiplexers.

42. The circuit of claim 40, further comprising:
a divider coupled to outputs of one or more multiplexers.

43. The circuit of claim 39, wherein the preselected ratio between the frequency of the first-stage output signal and the frequency of the second-stage output signal from each second-stage frequency conversion block is programmable.

44. The circuit of claim 39, wherein the frequency of the first-stage output signal is an integer or fractional multiple of the frequency of the first-stage input signal.

45. A method for generating signals, comprising:
providing a first reference signal to a first-stage frequency conversion circuit;
generating a second reference signal by the first-stage frequency conversion circuit, wherein a frequency of the second reference signal has a preselected relationship to a frequency of the first reference signal;
providing the second reference signal to a plurality of second-stage frequency conversion circuits; and
generating a second-stage output signal by each second-stage frequency conversion circuit, wherein a frequency of each second-stage output signal has a preselected relationship to the frequency of the second reference signal, wherein each of the second-stage output signals comprises quadrature signals and wherein the second stage output signals are selected by using one or more multiplexers.

46. The method of claim 45, further comprising:
providing one or more outputs of the multiplexers to one or more mixers.

47. The method of claim 45 wherein the preselected relationship between the frequency of the second reference signal and the frequency of the first reference signal is an integer or fractional multiple.

48. The method of claim 45, wherein the second-stage frequency conversion circuits are phase-locked loops (PLL).

49. The method of claim 45, wherein the second-stage frequency conversion circuits are delay-locked loops (DLL).

50. The method of claim 45, wherein the preselected relationship between the frequency of the second-stage output signal and the frequency of the second reference signal is programmable.

51. The method of claim 45, further comprising:
providing one or more outputs of the multiplexers to one or more dividers, wherein the dividers divide a frequency of a selected second-stage output signal by a factor of two.

52. The method of claim 51, further comprising:
providing outputs of the dividers to one or more mixers.

53. The method of claim 48, wherein the second stage PLLs are ring oscillator PLLs.

54. The method of claim 45, wherein the plurality of second-stage frequency conversion circuits comprises at least three phase-locked loops (PLLs), and wherein a frequency offset between a first second-stage output signal and a second second-stage output signal is the same as a frequency offset between the second second-stage output signal and a third second-stage output signal.

* * * * *